United States Patent [19]
Naraki et al.

[11] Patent Number: 6,134,007
[45] Date of Patent: *Oct. 17, 2000

[54] METHOD FOR MEASURING ORTHOGONALITY HAVING A THIRD INTERFEROMETER WHICH IS NOT ORTHOGONAL

[75] Inventors: Tsuyoshi Naraki, Setagaya-ku; Shuji Kawamura, Kawasaki, both of Japan

[73] Assignee: Nikon Corporation, Tokyo, Japan

[ * ] Notice: This patent is subject to a terminal disclaimer.

[21] Appl. No.: 09/310,959

[22] Filed: May 13, 1999

Related U.S. Application Data

[62] Division of application No. 08/754,012, Nov. 20, 1996.

[30] Foreign Application Priority Data

Dec. 4, 1995 [JP] Japan ................................ 7-339964

[51] Int. Cl.$^7$ ...................................... G01B 9/02
[52] U.S. Cl. ........................................ 356/358; 356/363
[58] Field of Search .......................... 356/358, 363, 356/399, 400; 250/548; 355/53; 33/1 M

[56] References Cited

U.S. PATENT DOCUMENTS

| | | |
|---|---|---|
| 4,311,390 | 1/1982 | Phillips . |
| 4,676,649 | 6/1987 | Phillips . |
| 4,742,286 | 5/1988 | Phillips . |
| 5,440,397 | 8/1995 | Ono et al. . |
| 5,523,843 | 6/1996 | Yamane et al. . |
| 5,532,822 | 7/1996 | Shinozaki et al. . |
| 5,995,225 | 11/1999 | Naraki et al. ............................ 356/358 |

*Primary Examiner*—Samuel A. Turner
*Attorney, Agent, or Firm*—Oliff & Berridge, PLC

[57] ABSTRACT

A projection exposure apparatus has a function to measure orthogonality between movement mirrors for interferometers for measuring positions of a substrate table in X and Y directions. The substrate table is moved by a distance L along a direction of a third axis which is included in an XY plane and inclined at an angle $\alpha$ with respect to a Y axis, while operating a movement mirror and an interferometer for the direction of the third axis. A component in the Y direction corresponding to the distance L in the direction of the third axis is defined as d. A movement distance of the substrate table in the X direction after movement of the substrate table by the distance L in the direction of the third axis is determined by the interferometer for measuring the position in the X direction, which is defined as S. An orthogonality error $\theta$ can be determined in accordance with $\theta=\tan^{-1}[(d-S)/d]$. The position of the substrate table can be correctly controlled by moving the substrate table while giving an offset to correct the error. This function can be also applied to a mask stage.

47 Claims, 4 Drawing Sheets

METHOD FOR MEASURING ORTHOGONALITY HAVING A THIRD INTERFEROMETER WHICH IS NOT ORTHOGONAL

This application is a Div of Ser. No. 08/754,012 filed Nov. 20, 1996.

FIELD OF THE INVENTION

The present invention relates to a method for measuring orthogonality, a stage apparatus, and an exposure apparatus. In particular, the present invention relates to a method for measuring orthogonality, preferably used, for example, to measure orthogonality between movement mirrors for interferometers for both X and Y axes in order to measure a position of an XY stage, as well as a stage apparatus to which the method for measuring orthogonality is applied, and an exposure apparatus provided with the stage apparatus. Especially, the present invention is preferably applied to an exposure apparatus for producing liquid crystal devices, for which it is necessary to decrease an overlay error caused by the operation for a long span.

DESCRIPTION OF THE RELATED ART

A conventional exposure apparatus for producing liquid crystal devices includes a Y movement mirror and an X movement mirror which are orthogonal to one another and provided on an XY stage to extend in an X axis direction and a Y axis direction respectively, or the apparatus includes an L-shaped movement mirror equivalent to the X and Y movement mirrors. The movement mirrors are irradiated with laser beams radiated from a Y axis laser interferometer and an X axis laser interferometer. Light beams reflected by the movement mirrors are received so that positions of the respective movement mirrors are measured. Thus, a coordinate of the XY stage is calculated, and then exposure is performed in accordance with the step-and-repeat system. However, strictly speaking, the Y movement mirror and the X movement mirror, or respective sides of the L-shaped movement mirror are not completely orthogonal to one another due to the presence of, for example, a production error or an assembly error. Accordingly, an orthogonality error exists.

Therefore, the conventional exposure apparatus has a drawback in that an array of shot areas formed on a photosensitive substrate such as a glass plate is distorted if exposure is performed in accordance with the step-and-repeat system on the basis of positions of the movement mirrors involving such an orthogonality error. Thus, even in the case of the conventional exposure apparatus, the exposure operation has been performed in accordance with, for example, the following technique in order to correct such an error in orthogonality. Namely, a photosensitive substrate once subjected to exposure is rotated by 90 degrees, and it is placed on the XY stage again. The photosensitive substrate is subjected to exposure again to form a pattern from which an orthogonality error (discrepancy angle) between the movement errors is measured. Thus, a correction value corresponding to an amount of the orthogonality error is calculated beforehand. When the stage is moved, the correction value corresponding to the amount of the orthogonality error is added as an offset to an amount of movement of the stage so that the array of shot areas does not undergo occurrence of distortion.

Usually, such an exposure apparatus is installed in a clean room at a constant temperature. Further, a main exposure apparatus body is accommodated in a chamber in which the temperature is adjusted more accurately than in the clean room. Thus, attention is paid so that the positional measurement accuracy of the interferometer is not changed due to deformation of the movement mirror caused by secular change. However, variation in temperature (increase or decrease) occurs due to stoppage of temperature control involved in stoppage of operation of the clean room during maintenance or the like. Moreover, an mistake in operation may be made by a maintenance operator. Such various causes make it impossible to completely negate the fear that any prank may occur in orthogonality between the movement mirrors. Thus it is necessary to confirm an orthogonality error by occasionally measuring the orthogonality, and determine a correction value (correction parameter) so that the value is inputted again.

In addition to the aforementioned method in which a plate is subjected to exposure twice, for example, the following method has been hitherto conceived for measuring the orthogonality error. Namely, the orthogonality is measured such that a fiducial plate composed of a material such as quartz having a small expansion coefficient, i.e., a fiducial plate which scarcely suffers secular change is stored, so as to determine an error between a coordinate system for a pattern on the fiducial plate and a coordinate system for a pattern with which a substrate is exposed by the aid of an apparatus presently used. However, in any of the foregoing methods, it is impossible to measure the orthogonality by using only a single exposure apparatus. It has been necessary to make measurement by using an exclusive measuring instrument with considerable time and labor.

SUMMARY OF THE INVENTION

An object of the present invention is to dissolve the inconvenience involved in the preceding techniques described above, and provide a method for measuring orthogonality in which orthogonality between movement mirrors installed on a stage movable in two-dimensional directions can be easily measured without using any special measuring instrument.

Another object of the present invention is to provide a stage apparatus in which an orthogonality error between movement mirrors installed on a stage movable in two-dimensional directions can be measured, and a positional error of the stage caused by the orthogonality error can be corrected.

Still another object of the present invention is to provide an exposure apparatus provided with a stage apparatus in which an orthogonality error between movement mirrors installed on a stage movable in two-dimensional directions can be measured, and a positional error caused by the orthogonality error can be corrected.

According to a first aspect of the present invention, there is provided a method for measuring orthogonality between a movement mirror for a first interferometer and a movement mirror for a second interferometer, arranged orthogonally to a first axis and a second axis respectively on a stage which is movable two-dimensionally along the first axis and the second axis orthogonal thereto, comprising:

a first step of moving the stage by a distance L along a direction of a third axis which forms an angle α with respect to the first axis, the first, second, and third axes being in an identical plane;

a second step of determining a movement amount S of the stage in a direction of the second caused by the movement of the stage by the distance L, on the basis of a measured value obtained by the second interferometer; and a third step of calculating a discrepancy angle θ for the orthogonality between the movement mirrors for the first and second interferometers in accordance with geometrical calculation by using the distance L, the movement amount S, and the angle α.

According to this method, the stage is moved by the predetermined distance L along the direction of the third axis which forms the known angle α with respect to the first axis, the first, second, and third axes being in the identical plane. At this time, the movement amount S of the stage in the direction of the second axis caused by the movement of the stage by the distance L is determined on the basis of the measured value obtained by the second interferometer. If no error occurs in the orthogonality between the movement mirrors, the movement amount S of the stage in the direction of the second axis, which is provided when the stage is moved by the predetermined distance L along the direction of the third axis, should be coincident with a movement amount S' which is determined by a geometrical relationship (Pythagorean theorem) based on the predetermined distance L and the known angle α. Therefore, if a difference between the both movement amounts is known, the orthogonality error θ can be calculated on the basis of the difference. Thus the discrepancy angle θ for the orthogonality between the both movement mirrors is calculated in accordance with geometrical calculation by using the distance L, the movement amount S, and the angle α. Accordingly, the orthogonality between the movement mirrors can be easily measured without using any special measuring instrument. Any of the X and Y directions, in which the stage is moved, may be selected for the first axis (or the second axis).

According to a second aspect of the present invention, there is provided a method for measuring orthogonality between a movement mirror for a first interferometer and a movement mirror for a second interferometer, arranged orthogonally to a first axis and a second axis respectively on a stage which is movable two-dimensionally along the first axis and the second axis orthogonal thereto, comprising:

a first step of moving the stage by a distance L along a direction of a third axis which forms an angle α with respect to the first axis, the first, second, and third axes being in an identical plane;

a second step of determining a yawing angle φ resulted from the movement of the stage by the distance L, on the basis of a measured value obtained by the first interferometer;

a third step of determining a movement amount S of the stage in a direction of the second axis, caused by the movement of the stage by the distance L, on the basis of a measured value obtained by the second interferometer;

a fourth step of calculating an orthogonality error θ between the movement mirrors for the first and second interferometers in accordance with geometrical calculation by using the distance L, the movement amount S, and the angle α, the orthogonality error θ including a yawing component; and a fifth step of determining a true orthogonality error θ' between the movement mirrors for the first and second interferometers by subtracting the yawing angle φ determined in the second step from the orthogonality error θ calculated in the fourth step.

According to the method in accordance with the second aspect of the present invention, the stage is moved by the predetermined distance L along the direction of the third axis which forms the known angle α with respect to the first axis, the first, second, and third axes being in the identical plane. At this time, the yawing angle φ resulted from the movement of the stage by the distance L is determined on the basis of the measured value obtained by the first interferometer, and the movement amount S of the stage in the direction of the second axis is determined in conformity with the movement of the stage by the distance L, on the basis of the measured value obtained by the second interferometer. If no yawing occurs when the stage is moved, the movement amount S of the stage in the direction of one axis should be coincident with a movement amount which is determined by a geometrical relationship (Pythagorean theorem) based on the distance L and the angle α. Therefore, if a difference between the both movement amounts is known, the yawing angle φ can be computed on the basis of the difference. On the other hand, the orthogonality error θ (this error includes the yawing component) can be determined on the basis of the movement amount S of the stage in the direction of the second axis in the same manner as determined in the method according to the first aspect. Thus the orthogonality error θ including the yawing component, between the both movement mirrors is calculated in accordance with geometrical calculation by using the distance L, the movement amount S, and the angle α. The true orthogonality error θ' between the both movement mirrors is determined by subtracting the yawing angle φ from the calculated orthogonality error θ. Accordingly, the orthogonality between the movement mirrors can be measured easily and correctly without using any special measuring instrument even if any yawing occurs upon the movement of the stage.

According to a third aspect of the present invention, there is provided a stage apparatus comprising:

a stage which is movable two-dimensionally along a first axis and a second axis orthogonal thereto;

a first interferometer for measuring a position of the stage in a direction of the first axis;

a second interferometer for measuring a position of the stage in a direction of the second axis;

a movement mirror for the first interferometer and a movement mirror for the second interferometer, arranged orthogonally to the first axis and the second axis respectively on the stage;

a reflective surface formed on the stage and inclined at an angle β with respect to the first axis;

a third interferometer for radiating a light beam along a direction of a third axis orthogonal to the reflective surface, and receiving a reflected light beam from the reflective surface to measure a position of the stage in the direction of the third axis;

a control system for controlling movement of the stage in the directions of the first, second, and third axes; and a first computing unit for calculating an error in orthogonality between the movement mirrors for the first and second interferometers in accordance with geometrical calculation by using an output of the first interferometer, an output of the third interferometer, and the angle β. The first computing unit may determine a correction value for the orthogonality on the basis of the error in the orthogonality calculated by the first computing unit, and the control system may control the two-dimensional movement of the stage on the basis of the correction value.

According to the stage apparatus of the present invention, when the stage is driven and controlled in the direction of the third axis while monitoring the first and third interferometers by the aid of the control system, the orthogonality error between the both movement mirrors is calculated by the first computing unit in accordance with geometrical calculation by using the output of the second interferometer, the output of the third interferometer, and the angle β. The movement position of the stage can be corrected on the basis of the calculated orthogonality error. Therefore, it is possible to detect and correct the orthogonality error without using any special measuring instrument.

Preferably, the stage apparatus of the present invention further comprises a second computing unit for calculating a yawing angle φ of the stage on the basis of the output of the first interferometer, the output of the third interferometer, and the angle β, wherein the first computing unit calculates the error in the orthogonality between the movement mirrors for the first and second interferometers in accordance with geometrical calculation by using the output of the first interferometer, the output of the third interferometer, the angle β, and the yawing angle φ. Even if any yawing occurs upon movement of the stage, the orthogonality error between the movement mirrors can be easily measured. The stage can be correctly positioned based thereon.

Preferably, in the stage apparatus of the present invention, the third axis is set to pass through an intersection between optical paths of a light beam radiated from the first interferometer and a light beam radiated from the second interferometer. According to this preferred embodiment, even if any yawing occurs upon movement of the stage, the orthogonality between the movement mirrors can be measured easily and correctly without using any special measuring instrument. Moreover, no error (Abbe error) is included in measured values obtained by the respective interferometers because the beams radiated from the three interferometers intersect at one point. Thus, the measurement accuracy is improved.

According to a fourth aspect of the present invention, there is provided an exposure apparatus for transferring a pattern formed on a mask onto a photosensitive substrate through a projection optical system, comprising:

a mask stage for holding the mask; and a substrate stage for holding the photosensitive substrate;

at least one of said mask stage and said substrate stage being a stage which is movable two-dimensionally along a first axis and a second axis orthogonal to one another in a plane perpendicular to an optical axis of the projection optical system and which comprises;

a first interferometer for measuring a position of the stage in a direction of the first axis;

a second interferometer for measuring a position of the stage in a direction of the second axis;

a movement mirror for the first interferometer and a movement mirror for the second interferometer, arranged orthogonally to the first axis and the second axis respectively on the stage;

a reflective surface formed on the stage and inclined at an angle β with respect to the first axis;

a third interferometer for radiating a light beam along a direction of a third axis orthogonal to the reflective surface, and receiving a reflected light beam from the reflective surface to measure a position of the stage in the direction of the third axis;

a control system for controlling movement of the stage in the directions of the first, second, and third axes; and a first computing unit for calculating an error in orthogonality between the movement mirrors for the first and second interferometers in accordance with geometrical calculation by using an output of the first interferometer, an output of the third interferometer, and the angle β.

According to the exposure apparatus of the present invention, the error in the orthogonality between the movement mirrors installed on the substrate stage and/or mask stage is computed, and a correction value for the orthogonality is computed so that any influence exerted by the orthogonality error is canceled. Upon actual exposure, the exposure is performed while positioning the stage on the basis of a command value obtained by adding the correction value as an offset. Thus it is possible to realize exposure free from distortion of any shot array.

Preferably, the exposure apparatus of the present invention further comprises a second computing unit for calculating a yawing angle φ of the stage on the basis of the output of the first interferometer, the output of the third interferometer, and the angle β, wherein the first computing unit calculates the error in the orthogonality between the movement mirrors for the first and second interferometers in accordance with geometrical calculation by using the output of the first interferometer, the output of the third interferometer, the angle β, and the yawing angle φ.

The exposure apparatus of the present invention can be applied to a scanning type exposure apparatus such as those of the slit scan type, a collective exposure type exposure apparatus such as steppers, and a collective scanning type exposure apparatus used for, for example, exposure for substrates of liquid crystal devices.

DETAILED DESCRIPTION OF PREFERRED EMBODIMENTS

Figure 1:
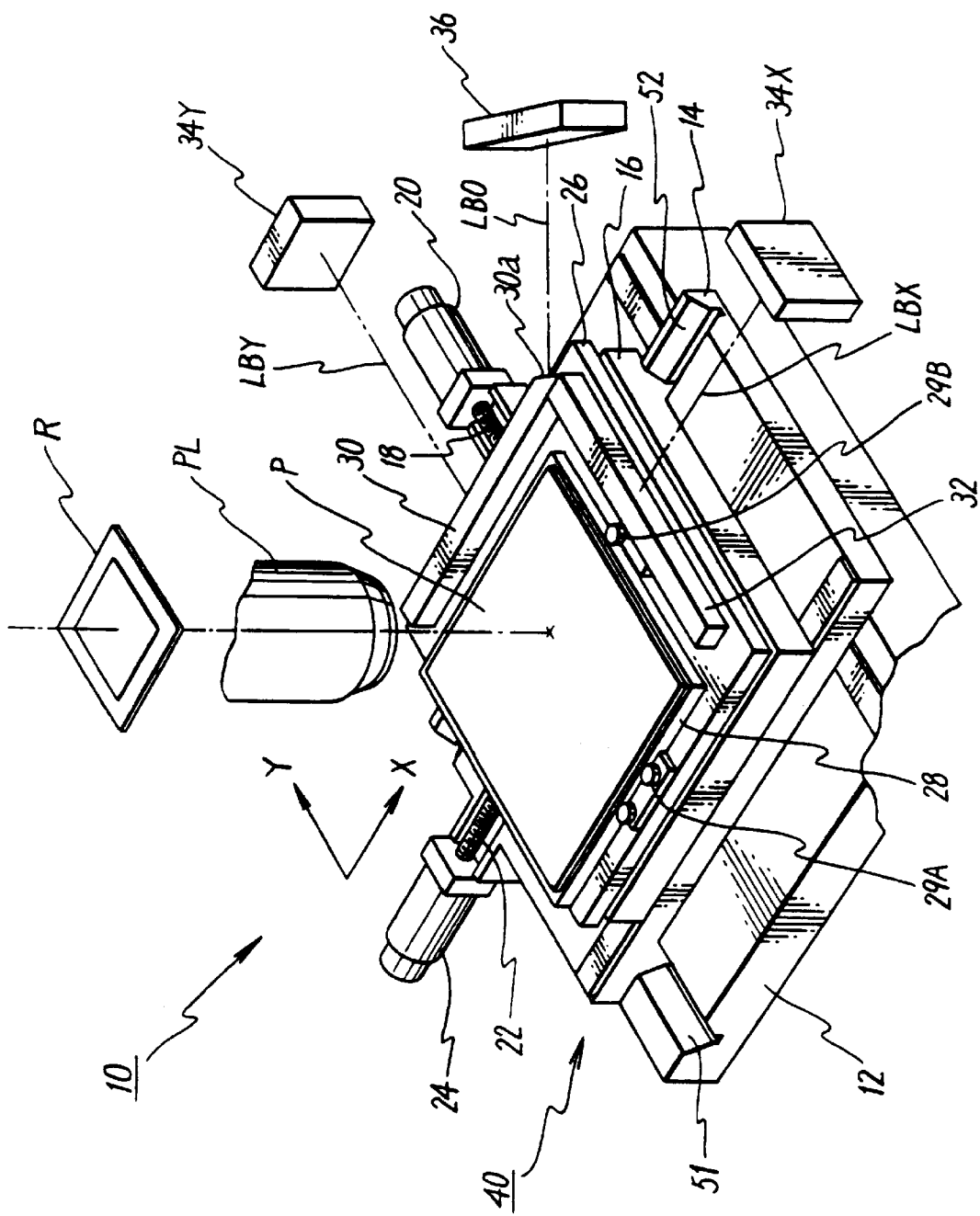
FIG. 1 shows a schematic perspective view illustrating an arrangement of principal components of an exposure apparatus concerning an embodiment of the present invention.

An embodiment of the present invention will be explained below with reference to FIGS. 1 to 4. FIG. 1 shows an arrangement of principal components of an exposure apparatus 10 of the step-and-repeat system concerning the embodiment for carrying out the method for measuring orthogonality according to the present invention. The exposure apparatus 10 comprises a reticle R as a mask, a projection optical system PL for projecting a pattern depicted on the reticle R onto a glass plate P as a photosensitive substrate for producing a liquid crystal display substrate, and a stage apparatus 40 on which the glass plate P is carried.

The stage apparatus 40 comprises a base 12 placed horizontally on an unillustrated vibration-preventive pedestal, a Y stage 14 provided movably on the base 12 along V flat guides in a direction of a Y axis as a first axis, and an X stage 16 provided movably on the Y stage 14 along V flat guides in a direction of an X axis as a second axis orthogonal to the Y axis.

A Y-driving motor 20 for driving the Y stage 14 through a feed screw 18 is secured to one end of the base 12 in the direction of the Y axis. An X-driving motor 24 for driving the X stage 16 through a feed screw 22 is secured to one end of the Y stage 14 in the direction of the X axis. The motors 20, 24 are controlled by a control unit 50 described later on (not shown in FIG. 1, see FIG. 2).

A substrate table 26 as a stage is carried on the X stage 16. Actually, the substrate table 26 is movable vertically along a direction of a Z axis orthogonal to the XY plane, and finely rotatable about the Z axis by the aid of an unillustrated driving system. A substrate holder 28 is placed on the substrate table 26, and it is positioned by positioning rollers 29A, 29B. The glass plate P as the photosensitive substrate is attracted and held on the substrate holder 28.

A movement mirror 30 for a Y axis interferometer is provided at one end on the substrate table 26 in the Y axis direction to extend along the X axis direction. The Y axis interferometer 34Y is arranged and opposed to the movement mirror 30, which serves as a first interferometer for irradiating the movement mirror 30 with a length-measuring beam LBY, and receiving a reflected light beam from the movement mirror 30 to measure a position of the movement mirror 30 in the Y axis direction, i.e., a position of the substrate table 26 in the Y axis direction. On the other hand, a movement mirror 32 for an X axis interferometer is provided at one end on the substrate table 26 in the X axis direction to extend along the Y axis direction. An X axis interferometer 34X is arranged and opposed to the movement mirror 32, which serves as a second interferometer for irradiating the movement mirror 32 with a length-measuring beam LBX, and receiving a reflected light beam from the movement mirror 32 to measure a position of the movement mirror 32 in the X axis direction, i.e., a position of the substrate table 26 in the X axis direction. Output signals of the Y axis interferometer 34Y and the X axis interferometer 34X are inputted into the control unit 50 (not shown in FIG. 1, see FIG. 2).

A reflective surface 30a, which forms a known angle β (in this embodiment, β=45 degrees (see FIG. 3A)) with respect to the Y axis as a measuring axis, is formed at one end of the movement mirror 30. An interferometer 36 for measuring orthogonality is arranged and opposed to the reflective surface 30a, which serves as a third interferometer for irradiating the reflective surface 30a with a length-measuring beam LBO in a direction of a third axis (the direction of LBO forms an angle α with respect to the Y axis, in this embodiment, α=45 degrees), and receiving a reflected light beam from the reflective surface 30a to measure a position of the reflective surface 30a in the direction of the third axis, i.e., a position of the substrate table 26 in the direction of the third axis. The length-measuring beam LBO in the direction of the third axis, which is orthogonal to the reflective surface 30a, intersects a point of intersection between extended lines of the length-measuring beam LBY and the length-measuring beam LBX, i.e., a point on an optical axis of the projection optical system PL as a point of intersection between the Y axis and the X axis. An output signal of the interferometer 36 for measuring orthogonality is also inputted into the control unit 50 described above (not shown in FIG. 1, see FIG. 2).

The projection optical system PL, which is held by an unillustrated main column body, is arranged over the substrate table 26. A circuit pattern formed on the reticle R is projected at a predetermined magnification onto the glass plate P including a photosensitive layer formed on its surface, by the aid of the projection optical system PL.

Figure 2:
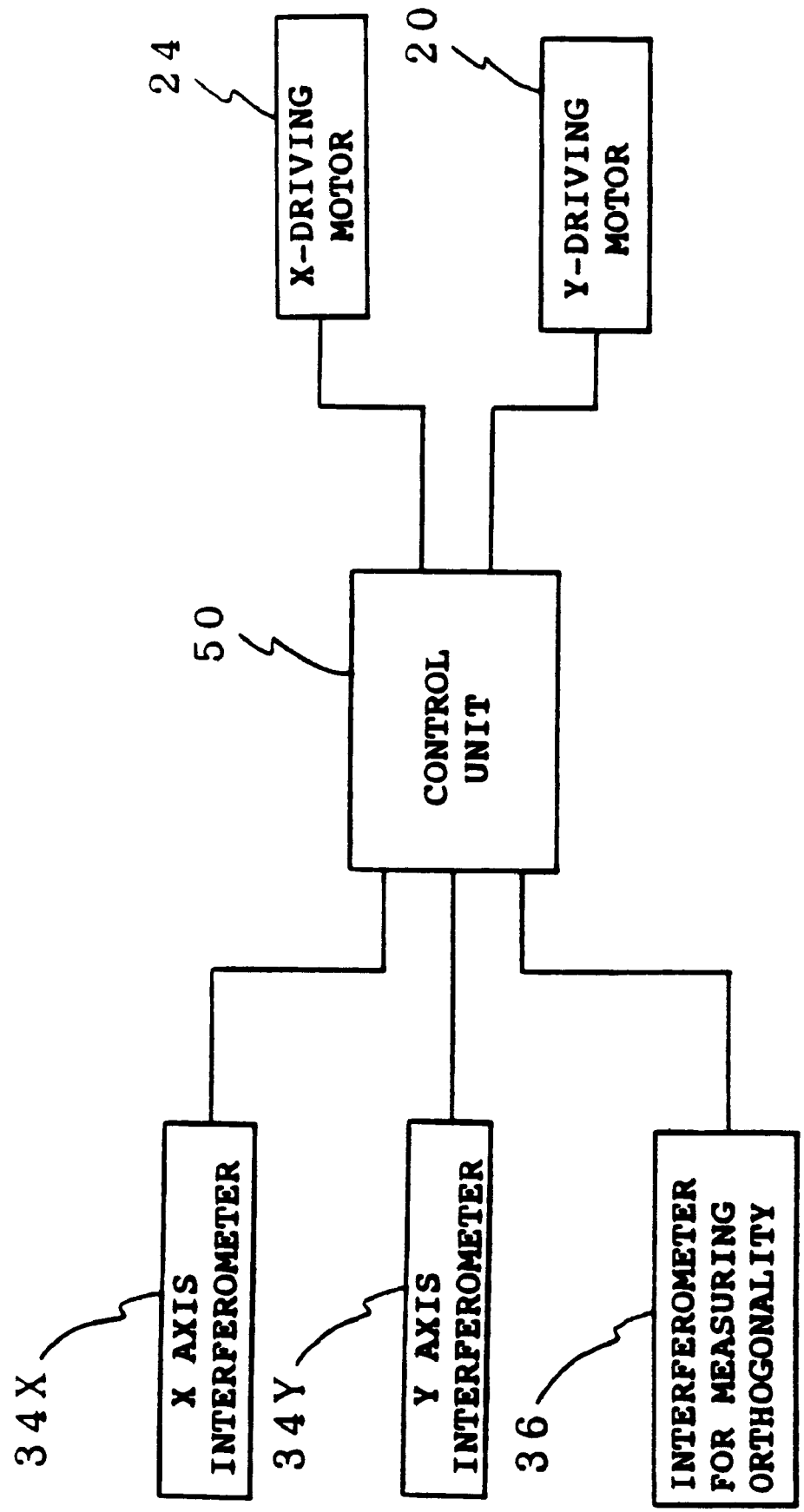
FIG. 2 shows a block diagram illustrating an arrangement of a control system concerning measurement of orthogonality performed by the apparatus shown in FIG. 1.

FIG. 2 shows an arrangement of a control system concerning measurement of orthogonality performed by the exposure apparatus 10. This control system comprises the control unit 50 which plays a central role in operation, including a microcomputer comprising, for example, CPU, ROM, and RAM. Those stored in RAM of the control unit 50 include the angle β (or α) described above, mathematical expressions for calculating orthogonality described later on, and other data. Those stored in ROM include, for example, a predetermined exposure processing program, and a program for measuring orthogonality between the movement mirrors 30, 32 described later on.

Figure 3A:
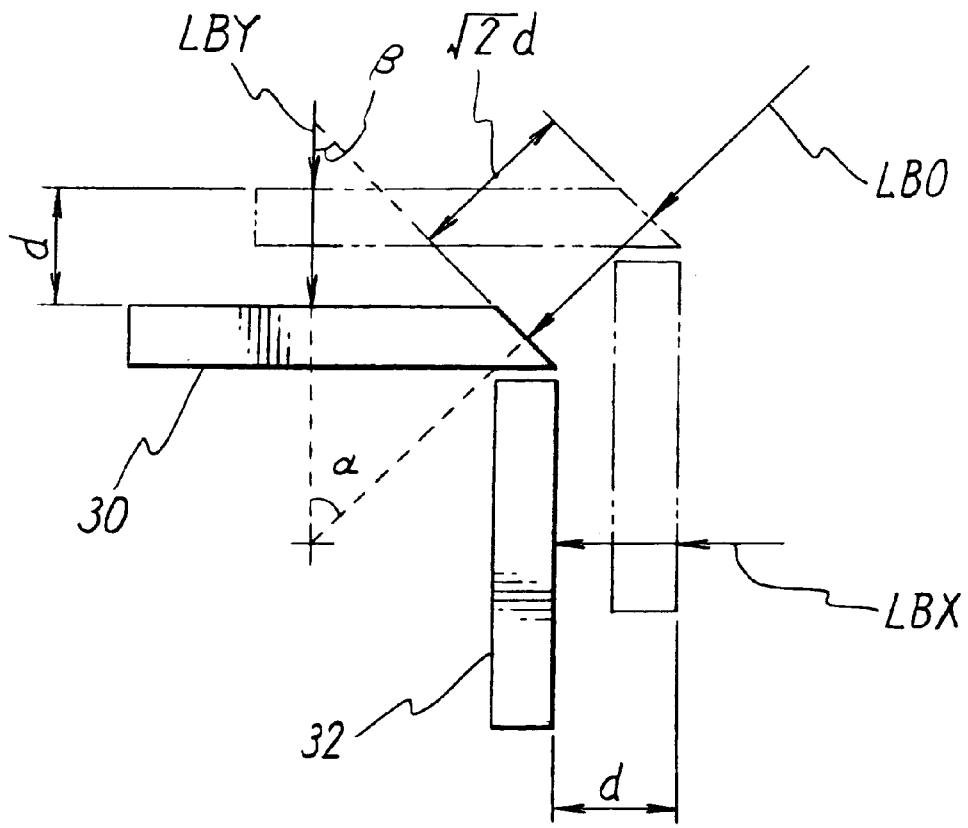
FIG. 3A conceptually shows ideal change in positions of movement mirrors, obtained when no error exists in orthogonality between the movement mirrors on a stage.
Figure 3B:
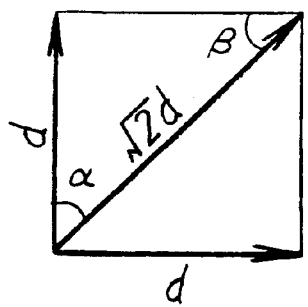
FIG. 3B schematically shows a state of movement of a substrate table corresponding to FIG. 3A.

Next, explanation will be made for measurement of orthogonality between the movement mirrors 30, 32, performed by the exposure apparatus 10 constructed as described above. At first, the motors 20, 24 are driven to move the substrate table 26 in the direction of the third axis (in the direction of the length-measuring beam LBO) by a predetermined distance, for example, by $L=\sqrt{2}d$, while monitoring an output of the interferometer 36 for measuring orthogonality and an output of the Y axis interferometer 34Y by the aid of CPU in the control unit 50. Now assuming that the yawing (angle of rotation about the Z axis), which is brought about when the substrate table 26 is moved, is sufficiently small to be negligible, the substrate table 26 is moved by d in the Y direction in accordance with a geometrical relationship as shown in FIG. 3B. If the movement mirror 30 and the movement mirror 32 are correctly orthogonal to one another, the substrate table 26 is also moved by d in the X direction. An output signal (pulse signal), which represents a positional change corresponding to the distance d, is fed from the X axis interferometer 34X and inputted into the control unit 50. Namely, a state is given as shown in FIG. 3A.

Figure 4A:
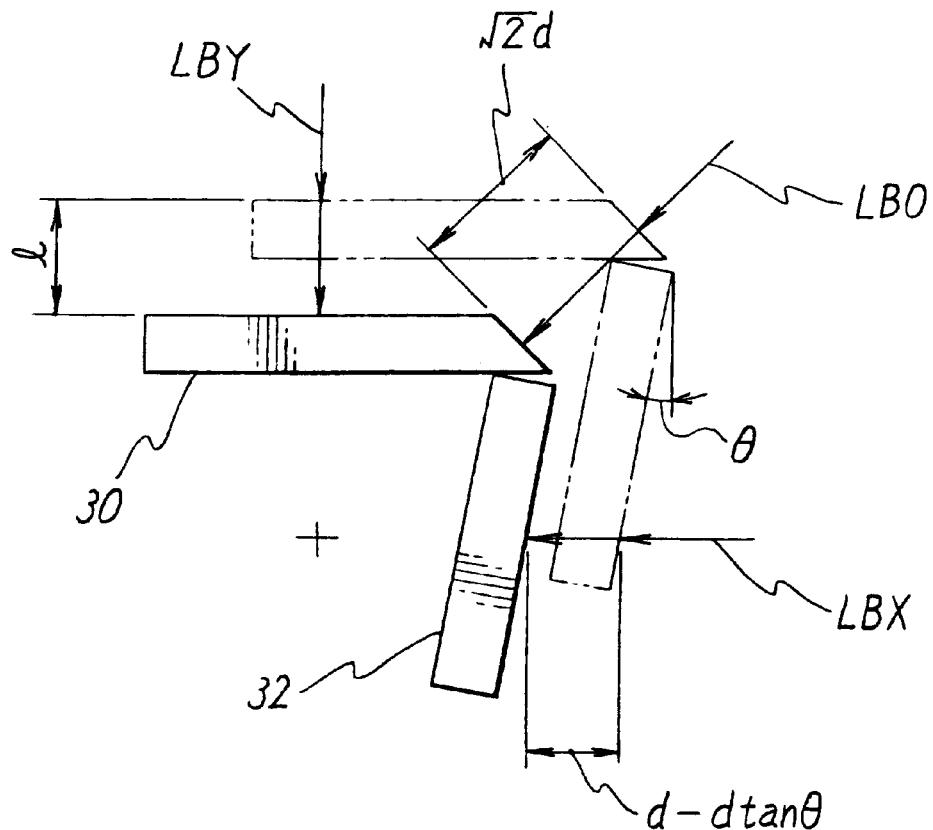
FIG. 4A conceptually shows change in positions of movement mirrors, obtained when an error θ exists in orthogonality between the movement mirrors on a stage.
Figure 4B:
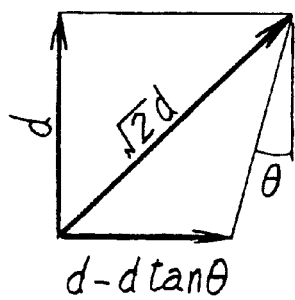
FIG. 4B schematically shows a state of movement of a substrate table corresponding to FIG. 4A.

However, if the angle formed by the movement mirrors 30, 32 is acute by θ with respect to the orthogonal state as shown in FIG. 4A, the substrate table 26 is moved in the X axis direction by (d−d tan θ), not by d, in accordance with a geometrical relationship as shown in FIG. 4B.

Therefore, assuming that the output of the X axis interferometer 34X is S, the orthogonality error θ can be calculated on the basis of the output S of the X axis interferometer 34X in accordance with the following expression.

$$\theta = \tan^{-1}\{(d-S)/d\} \quad (1)$$

Figure 4C:
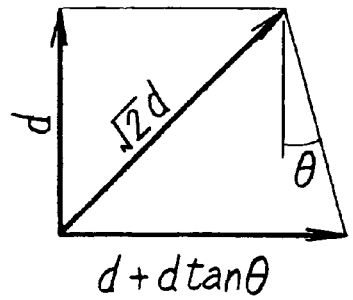
FIG. 4C schematically shows a state of movement of the substrate table when an angle formed by the movement mirrors is an obtuse angle.

It is noted that θ in the foregoing expression has a positive value when the angle formed by the movement mirrors 30, 32 is acute, or it has a negative value when the angle is obtuse (see FIG. 4C).

CPU in the control unit 50 monitors the output S of the X axis interferometer 34X during a period of the movement of the substrate table 26 by the distance $L=\sqrt{2}d$ in the direction of the length-measuring beam LBO to determine the orthogonality error θ on the basis of the foregoing expression (1). CPU computes a correction value for the orthogonality so that the influence of the orthogonality error θ is canceled. The correction value is stored in RAM.

Upon actual exposure, the correction value stored in RAM is added as an offset to a control amount for the X stage 16 and a control amount for the Y stage 14 during stepping to obtain command values which are given to the motors 24, 20 to position each of shots, and thus the exposure is performed. Accordingly, the influence of the orthogonality error between the movement mirrors 30, 32 is canceled to realize exposure in which any shot array is free from distortion.

The foregoing explanation has been made on the assumption that the yawing (angle of rotation about the Z axis), which is brought about when the substrate table 26 is moved, is sufficiently small to be negligible. However, when the substrate table 26 is actually moved, the yawing has a degree of magnitude which is not negligible. However, in this embodiment, the motors 20, 24 are driven to move the substrate table 26 in the direction of the third axis (in the direction of the length-measuring beam LBO) by the predetermined distance L=√2d, while monitoring the output of the interferometer 36 for measuring orthogonality and the output of the Y axis interferometer 34Y. Accordingly, the yawing angle $\phi$ (this angle is a minute amount) of the substrate table 26 can be determined in accordance with the following expression on the basis of a difference $\Delta d=d'-d$ between the output d' of the Y axis interferometer 34Y at this time and the theoretical movement distance d of the substrate table 26 in the Y axis direction.

$$\tan \phi \approx \phi = \Delta d \qquad (2)$$

Therefore, CPU in the control unit 50 performs the following operation. Namely, the yawing angle $\phi$ is subtracted from the orthogonality error $\theta$ (this error includes the yawing component described above) calculated in accordance with the foregoing expression (1) to calculate a true orthogonality error $\theta'$. A correction value for the orthogonality is computed so that the influence of the orthogonality error $\theta'$ is canceled, and the calculated correction value is stored in RAM. The correction value is added as an offset to a control amount for the X stage 16 and a control amount for the Y stage 14 during stepping to obtain command values which are given to the motors 24, 20 to position each of shots, and thus exposure is performed. Accordingly, the influence of the orthogonality error between the movement mirrors 30, 32 is canceled to realize exposure in which any shot array is free from distortion.

When the present invention is applied to an actual exposure apparatus, the following procedure is advantageous. Namely, a control algorithm is previously prepared so that the measurement of the orthogonality and the calculation of the correction value are repeatedly performed as described above at a desired timing, for example, every time when a lot is exchanged, every time when exposure is completed for a predetermined number of plates, for example, 20 or 10 sheets of plates, once per a day, every time when the power source is turned on, or every time when the light source (for example, a mercury lamp) is exchanged. By doing so, the orthogonality between the movement mirrors 30, 32 is automatically calibrated by the apparatus by itself without any operation to be performed by an operator (except for the operation to turn on the power source). The higher the repeating frequency of the measurement of the orthogonality and the calculation of the correction value is, the higher the positional control accuracy of the substrate table 26 based on the interferometers 34X, 34Y is as a whole. On the contrary, a higher frequency brings about decrease in throughput. Therefore, it is desirable to set the timing for the measurement of the orthogonality and the calculation of the correction value in conformity with actual circumstances, taking the balance between the increase in accuracy and the decreased in throughput into consideration. In any case, it is desirable to perform the measurement of the orthogonality and the calculation of the correction value at least when the apparatus is stopped for a long period of time, for example, upon stoppage of operation of the clean room, and upon maintenance for the apparatus.

As clarified from the foregoing explanation, the control system, the first computing unit, and the second computing unit are realized by the functions of the control unit 50 in this embodiment.

As explained above, according to this embodiment, the orthogonality error between the movement mirrors 30, 32 for the interferometers is conveniently measured, and the correction value is calculated by the exposure apparatus 10 by itself. Accordingly, it is possible to easily perform maintenance and management for the accuracy of the apparatus. Consequently, it is expected to improve the performance of devices to be produced.

The foregoing embodiment has exemplified the case in which the reflective surface 30a is formed on the movement mirror 30 so that the angle $\beta$ formed with respect to the Y axis is 45 degrees. However, the present invention is not limited thereto. The angle $\beta$ may be an arbitrary angle. In such a case, assuming that the movement distance of the substrate table 26 in the direction of the third axis is L, the orthogonality error $\theta$ can be determined in accordance with the following expression.

$$\theta = \tan^{-1}\{(L \cos \beta - S)/L \sin \beta\} \qquad (3)$$

It is noted that $\theta$ in the foregoing expression has a positive value when the angle formed by the movement mirrors 30, 32 is acute, or it has a negative value when the angle is obtuse.

Alternatively, an angle $\alpha$ formed by the Y axis and the length-measuring beam LBO may be used in place of the angle $\beta$ to determine the orthogonality error $\theta$ in accordance with the following expression.

$$\theta = \tan^{-1}\{(L \sin \alpha - S)/L \cos \alpha\} \qquad (4)$$

The yawing angle $\phi$ in this case is computed in accordance with the following expression (5) or (6) provided that the output of the Y axis interferometer 34Y is $L_y$.

$$\tan \phi \approx \phi = \Delta d = L_y - L \sin \beta \qquad (5)$$

$$\tan \phi \approx \phi = \Delta d = L_y - L \cos \alpha \qquad (6)$$

The foregoing embodiment has exemplified the case in which the optical path (third axis) of the length-measuring beam LBO radiated from the interferometer 36 is set to pass through the intersection of the optical paths of the length-measuring beam LBY from the Y axis interferometer 34Y and the length-measuring beam LBX from the X axis interferometer 34X. Such an arrangement has been adopted because of a merit of a high measurement accuracy as a premise of the calculation of the orthogonality described above (i.e., so-called Abbe error is not contained). However, the present invention is not limited thereto. The method for measuring orthogonality between the movement mirrors according to the present invention can be also applied to a case in which the optical path of the length-measuring beam LBO does not pass through the intersection between the length-measuring beam LBY and the length-measuring beam LBX.

It is allowable to set such that the interferometer 36 for measuring orthogonality is operated only during measurement, and the interferometer 36 is in a non-operating state during usual exposure. In this arrangement, an advantage is obtained, for example, in that the electric power consumption is decreased.

The foregoing embodiment has exemplified the case in which the two straight movement mirrors are used as the movement mirrors for the interferometers. However, the present invention is not limited thereto. The present invention can be equivalently applied to a stage which adopts an L-shaped mirror by providing an inclined reflective surface at a portion which scarcely suffers change in angle, specifically at a portion located on a side opposite to a corner of the L-shaped mirror.

According to the method of the present invention as explained above, the orthogonality between the movement mirrors can be easily measured without using any special measuring instrument. The stage apparatus of the present invention can move the stage to a correct position because the stage apparatus is provided with the function to measure the orthogonality error between the movement mirrors. The exposure apparatus including such a stage apparatus has the function to correct the orthogonality error between the movement mirrors on the substrate stage, if any. Accordingly, a substrate is exposed with an image which is faithful to a mask pattern, and no distortion occurs in any shot area.

The present invention may be practiced or embodied in other various forms without departing from the spirit or essential characteristics thereof. It will be understood that the scope of the present invention is indicated by the appended claims, and all variations and modifications concerning, for example, the magnitude of the angle concerning the reflective surface, the position to measure the angle concerning the reflective surface, the passage of the optical path of the length-measuring beam radiated from the third interferometer, the way of operation of the third interferometer, and the shape or conformation of the movement mirror, which come within the equivalent range of the claims, are embraced in the scope of the present invention.

What is claimed is:

1. A stage apparatus comprising:

a stage which is movable two-dimensionally along a first axis and a second axis orthogonal thereto;

a first interferometer that measures a position of the stage in a direction of the first axis;

a second interferometer that measures a position of the stage in a direction of the second axis;

a movement mirror for the first interferometer and a movement mirror for the second interferometer, arranged orthogonally to the first axis and the second axis respectively on the stage;

a reflective surface formed on the stage and inclined at an angle $\beta$ with respect to the first axis;

a third interferometer that radiates a light beam along a direction of a third axis orthogonal to the reflective surface, and that receives a reflected light beam from the reflective surface to measure a position of the stage in the direction of the third axis;

a control system that controls movement of the stage in the directions of the first, second, and third axes; and a first computing unit that calculates and error in orthogonality between the movement mirrors for the first and second interferometers in accordance with geometrical calculation by using an output of the first interferometer, an output of the third interferometer, and the angle $\beta$.

2. The stage apparatus according to claim 1, wherein the first computing unit computes a discrepancy angle $\theta$ for the orthogonality in accordance with $\theta=\tan^{-1}[(d-S)/d]$ provided that when the stage is moved in the direction of the third axis by a predetermined distance L, a movement amount of the stage in the direction of the second axis, obtained by the second interferometer, is S, and a component of the predetermined distance L in the direction of the first axis is d.

3. The stage apparatus according to claim 1, wherein the first computing unit determines a correction value for the orthogonality on the basis of the error in the orthogonality calculated by the first computing unit, and the control system controls the two-dimensional movement of the stage on the basis of the correction value.

4. The stage apparatus according to claim 1, further comprising a second computing unit that calculates a yawing angle $\phi$ of the stage on the basis of the output of the first interferometer, the output of the third interferometer, and the angle $\beta$, wherein the first computing unit calculates the error in the orthogonality between the movement mirrors for the first and second interferometers in accordance with geometrical calculation by using the output of the first interferometer, the output of the third interferometer, the angle $\beta$, and the yawing angle $\phi$.

5. The stage apparatus according to claim 4, wherein the yawing angle $\phi$ is determined in accordance with $\phi=\Delta d=d'-d$ provided that when the stage is moved in the direction of the third axis by a predetermined distance L, a component of the predetermined distance L in the direction of the first axis is d, and a measured value obtained by the first interferometer is d'.

6. The stage apparatus according to claim 4, wherein the first computing unit determines a correction value for the orthogonality on the basis of the error in the orthogonality calculated by the first computing unit, and the control system controls the two-dimensional movement of the stage on the basis of the correction value.

7. The stage apparatus according to claim 4, wherein the reflective surface is formed on a part of the movement mirror for the first interferometer so that the angle $\beta$ is 45°.

8. The stage apparatus according to claim 4, wherein the third axis is set to pass through an intersection between optical paths of a light beam radiated from the first interferometer and a light beam radiated from the second interferometer.

9. An exposure apparatus for transferring a pattern formed on a mask onto a photosensitive substrate through a projection optical system, comprising:

a mask stage that holds the mask; and a substrate stage that holds the photosensitive substrate;

at least one of said mask stage and said substrate stage being a movable stage which is movable two-dimensionally along a first axis and a second axis orthogonal to one another in a plane perpendicular to an optical axis of the projection optical system and which comprises:

a first interferometer that measures a position of the movable stage in a direction of the first axis;

a second interferometer that measures a position of the movable stage in a direction of the second axis;

a movement mirror for the first interferometer and a movement mirror for the second interferometer, arranged orthogonally to the first axis and the second axis respectively on the movable stage;

a reflective surface formed on the movable stage and inclined at an angle $\beta$ with respect to the first axis;

a third interferometer that radiates a light beam along a direction of a third axis orthogonal to the reflective surface, and that receives a reflected light beam from the reflective surface to measure a position of the movable stage in the direction of the third axis;

a control system that controls movement of the movable stage in the directions of the first, second, and third axes; and a first computing unit that calculates an error in orthogonality between the movement mirrors for the first and second interferometers in accordance with geometrical calculation by using an output of the first interferometer, an output of the third interferometer, and the angle $\beta$.

10. The exposure apparatus according to claim 9, wherein the first computing unit computes a discrepancy angle $\theta$ for the orthogonality in accordance with $\theta=\tan^{-1}[(d-S)/d]$ provided that when the movable stage is moved in the direction of the third axis by a predetermined distance L, a movement amount of the movable stage in the direction of the second axis, obtained by the second interferometer, is S, and a component of the predetermined distance L in the direction of the first axis is d.

11. The exposure apparatus according to claim 9, wherein the first computing unit determines a correction value for the orthogonality on the basis of the error in the orthogonality calculated by the first computing unit, and the control system controls the two-dimensional movement of the movable stage on the basis of the correction value.

12. The exposure apparatus according to claim 9, further comprising a second computing unit that calculates a yawing angle $\phi$ of the movable stage on the basis of the output of the first interferometer, the output of the third interferometer, and the angle $\beta$, wherein the first computing unit calculates the error in the orthogonality between the movement mirrors for the first and second interferometers in accordance with geometrical calculation by using the output of the first interferometer, the output of the third interferometer, the angle $\beta$, and the yawing angle $\phi$.

13. The exposure apparatus according to claim 12, wherein the first computing unit determines a correction value for the orthogonality on the basis of the error in the orthogonality calculated by the first computing unit, and the control system controls the two-dimensional movement of the movable stage on the basis of the correction value.

14. The exposure apparatus according to claim 9, wherein the reflective surface is formed on a part of the movement mirror for the first interferometer so that the angle $\beta$ is 45°.

15. The exposure apparatus according to claim 9, wherein said substrate stage is the movable stage, and further comprising:

a second computing unit that calculates a yawing angle $\phi$ of the movable stage on the basis of an output of the first interferometer, an output of the third interferometer, and the angle $\beta$; and wherein the first computing unit calculates the error between the movement mirrors for the first and second interferometers in accordance with geometrical calculation by using the output of the first interferometer, the output of the third interferometer, the angle $\beta$, and the yawing angle $\phi$.

16. The exposure apparatus according to claim 9, wherein the exposure apparatus is an exposure apparatus of a type selected from the group consisting of a collective exposure type exposure apparatus, a collective scanning type exposure apparatus, and a scanning type exposure apparatus.

17. A stage apparatus comprising:

a movable stage having a surface on which an object is placed;

a driving device connected to the stage and that drives the stage; and a position measuring device that measures a position of the stage and has a first position measuring section, a second position measuring section and a third position measuring section;

the first position measuring section including a first reflection member fixed to the stage along a first direction and a first beam transmitting unit that transmits a first measuring beam toward the first reflection member;

the second position measuring section including a second reflection member fixed to the stage along a second direction different from the first direction and a second beam transmitting unit that transmits a second measuring beam toward the second reflection member;

the third position measuring section including a third reflection member fixed to the stage along a third direction different from the first and second directions and a third beam transmitting unit that transmits a third measuring beam toward the third reflection member;

wherein a first virtual line extending from the first measuring beam through the first reflection member, a second virtual line extending from the second measuring beam through the second reflection member, and a third virtual line extending from the third measuring beam through the third reflection member are directed to a space formed by extending the surface of the stage in a direction perpendicular to the surface.

18. The stage apparatus according to claim 17, wherein at least two of the first virtual line extending from the first measuring beam, the second virtual line extending from the second measuring beam and the third virtual line extending from the third measuring beam intersect in the space.

19. The stage apparatus according to claim 18, wherein the first virtual line extending from the first measuring beam, the second virtual line extending from the second measuring beam and the third virtual line extending from the third measuring beam intersect in the space.

20. The stage apparatus according to claim 17, wherein the stage is mechanically connected to the driving device.

21. The stage apparatus according to claim 17, wherein the first reflection member is mounted on an upper surface of the stage.

22. The stage apparatus according to claim 17, wherein the first reflection member and the second reflection member are formed integrally.

23. The stage apparatus according to claim 17, wherein the first direction intersects the second direction at an angle of 45 degrees.

24. The stage apparatus according to claim 17, further comprising a controller connected to the position measuring device and that controls the stage based on measurement by the first, second and third position measuring sections.

25. The stage apparatus according to claim 17, wherein the space exists above the stage.

26. An exposure apparatus for exposing an object with a pattern, comprising:

an exposure device;

a movable stage having a surface on which the object is placed;

a driving device connected to the stage and that drives the stage; and a position measuring device that measures a position of the stage and has a first position measuring section, a second position measuring section and a third position measuring section;

the first position measuring section including a first reflection member fixed to the stage along a first direction and a first beam transmitting unit that transmits a first measuring beam toward the first reflection member;

the second position measuring section including a second reflection member fixed to the stage along a second direction different from the first direction and a second beam transmitting unit that transmits a second measuring beam toward the second reflection member;

the third position measuring section including a third reflection member fixed to the stage along a third direction different from the first and second directions and a third beam transmitting unit that transmits a third measuring beam toward the third reflection member;

wherein a first virtual line extending from the first measuring beam through the first reflection member, a second virtual line extending from the second measuring beam through the second reflection member, and a third virtual line extending from the third measuring beam through the third reflection member are directed to a space formed by extending the surface of the stage in a direction perpendicular to the surface.

27. The exposure apparatus according to claim 26, wherein at least two of the first virtual line extending from the first measuring beam, the second virtual line extending from the second measuring beam and the third virtual line extending from the third measuring beam intersect in the space.

28. The exposure apparatus according to claim 27, wherein the first virtual line extending from the first measuring beam, the second virtual line extending from the second measuring beam and the third virtual line extending from the third measuring beam intersect in the space.

29. The exposure apparatus according to claim 26, wherein the stage is mechanically connected to the driving device.

30. The exposure apparatus according to claim 26, wherein the first reflection member is mounted on an upper surface of the stage.

31. The exposure apparatus according to claim 26, wherein the first reflection member and the second reflection member are formed integrally.

32. The exposure apparatus according to claim 26, wherein the first direction intersects the second direction at an angle of 45 degrees.

33. The exposure apparatus according to claim 26, further comprising a controller connected to the position measuring device and that controls the stage based on measurement by the first, second and third position measuring sections.

34. The exposure apparatus according to claim 26, wherein the object is a photosensitive substrate.

35. The exposure apparatus according to claim 34, wherein the exposure device exposes the photosensitive substrate with the pattern.

36. The exposure apparatus according to claim 34, wherein the exposure apparatus is a step-and-repeat type exposure apparatus.

37. The exposure apparatus according to claim 26, wherein the space exists above the stage.

38. The exposure apparatus according to claim 26, wherein the driving device drives the stage in a first direction and in a second direction different from the first direction.

39. The exposure apparatus according to claim 26, wherein the driving device comprises a motor.

40. The exposure apparatus according to claim 26, wherein the exposure device comprises a projection system that projects the pattern onto the object.

41. The exposure apparatus according to claim 40, wherein the projection system optically projects the pattern onto the object.

42. The exposure apparatus according to claim 26, wherein the exposure device comprises a mask having the pattern.

43. The exposure apparatus according to claim 26, wherein the exposure device comprises a projection system that projects the pattern onto the object, the projection system being located between the mask and the object.

44. The exposure apparatus according to claim 26, wherein the stage is movably supported by a base member.

45. The exposure apparatus according to claim 44, wherein the base member has a guide member.

46. The exposure apparatus according to claim 44, wherein the base member supports the stage while contacting therewith.

47. The exposure apparatus according to claim 34, wherein the photosensitive substrate has a rectangular shape.

* * * * *

UNITED STATES PATENT AND TRADEMARK OFFICE
CERTIFICATE OF CORRECTION

PATENT NO. : 6,134,007  
DATED : October 17, 2000  
INVENTOR(S) : Tsuyoshi Naraki et al.

Page 1 of 1

It is certified that error appears in the above-identified patent and that said Letters Patent is hereby corrected as shown below:

<u>Title page,</u>  
Item [54], change the Title to be: -- METHOD FOR MEASURING ORTHOGONALITY, STAGE APPARATUS, AND EXPOSURE APPARATUS --

Signed and Sealed this

Eighteenth Day of December, 2001

Attest:

Attesting Officer

JAMES E. ROGAN  
Director of the United States Patent and Trademark Office